United States Patent [19]

Hyugaji

[11] Patent Number: 5,506,451
[45] Date of Patent: Apr. 9, 1996

[54] FLIP-CHIP SEMICONDUCTOR DEVISE HAVING AN ELECTRODE PAD COVERED WITH NON-METAL MEMBER

[75] Inventor: Masahiko Hyugaji, Yokohama, Japan

[73] Assignee: Kabushiki Kaisha Toshiba, Kawasaki, Japan

[21] Appl. No.: 363,322

[22] Filed: Dec. 23, 1994

[30]     Foreign Application Priority Data

Dec. 27, 1993  [JP]  Japan .................................. 5-347237

[51] Int. Cl.$^6$ ............................ H01L 23/48; H01L 29/54; H01L 29/60
[52] U.S. Cl. ........................ 257/778; 257/81; 257/763; 257/766; 257/448
[58] Field of Search ........................ 257/744, 745, 257/763, 766, 778, 777, 779, 764, 432, 459, 81, 447, 448, 772, 758

[56]         References Cited

U.S. PATENT DOCUMENTS

| | | | |
|---|---|---|---|
| 3,716,907 | 2/1973 | Anderson | 257/778 |
| 4,176,443 | 12/1979 | Iannuzzi et al. | 257/763 |
| 4,258,382 | 3/1981 | Harris | 257/737 |
| 4,651,191 | 3/1987 | Ooue et al. | 257/744 |
| 5,239,189 | 8/1993 | Lawrence | 257/81 |
| 5,247,204 | 9/1993 | Yokoyama | 257/763 |
| 5,260,603 | 11/1993 | Kamura et al. | 257/745 |
| 5,412,249 | 5/1995 | Hyugaji et al. | 257/763 |
| 5,416,359 | 5/1995 | Oda | 257/763 |

OTHER PUBLICATIONS

Levine et al., "Solder Terminal for Semiconductor Devices", IBM Technical Disclosure Bulletin, vol. 27, No. 9, Feb. 1985, p. 5252.

Ahn et al., "Permalloy Solder Barrier for Devices with Gold Conductor Metallization", IBM Tech. Disc., vol. 20, No. 12, May 1978, p. 5317.

"Solder Bump Formation with Anti-Erosion Polyimide Brim", IBM Tech. Disc., vol. 36, No. 10, Oct. 1993, pp. 529–530.

Jadus, "Flip Chip Terminal for Semiconductor Devices", IBM Tech. Disc., vol. 21, No. 3, Aug. 1978, p. 1007.

Kito et al., "High–Speed Flip–Chip InP/InGaAs Avalanche . . . ", IEEE Photonics Technology Letters, vol. 3, No. 12, Dec. 1991.

*Primary Examiner*—Rolf Hille
*Assistant Examiner*—Alexander Oscar Williams
*Attorney, Agent, or Firm*—Finnegan, Henderson, Farabow, Garrett & Dunner

[57]         ABSTRACT

An N-InP buffer layer is deposited on an N$^+$-InP substrate, an InGaAs light-absorbing layer is deposited on the buffer layer, an N$^-$-InP cap layer is deposited on the light-absorbing layer, and a P-type impurity region is formed in the light-absorbing layer and the cap layer. Next, a masking film is formed on the cap layer, and with this masking film serving as a mask, the cap layer, the light-absorbing layer, the buffer layer are etched, thus forming a P-type electrode forming region and an N-type electrode forming region. Next, an insulating film is provided for the periphery portion of the P-type impurity region of the cap layer. Electrode pads having a laminated structure is formed respectively on the P-type and N-type electrode forming regions, and a non-metal member is formed on the insulating film and on the surface, the periphery and the side surface of the electrode pad of the P-type electrode.

30 Claims, 3 Drawing Sheets

FLIP-CHIP SEMICONDUCTOR DEVISE HAVING AN ELECTRODE PAD COVERED WITH NON-METAL MEMBER

BACKGROUND OF THE INVENTION

1. Field of the Invention

The present invention relates to a compound semiconductor device, more specifically to an electrode structure capable of preventing deterioration of a semiconductor caused by a particular type of metal reacting there with, and enhancing the strength of mounting a metal electrode on a certain section so as to prevent the metal electrode from falling off, thereby increasing the reliability of the device, and simplifying the manufacturing process.

2. Description of the Related Art

Generally, an electronic device such as a transistor or a diode, in which a compound semiconductor is used, or a compound semiconductor device such as an optical device including a laser diode or photodiode, has a metal electrode designed for the connection with an external electric circuit. Conventionally, the connection between a metal electrode and an external electric circuit is carried out in the following manner. That is, with regard to one of the electrodes, a compound semiconductor chip is mounted on a wiring pattern of a substrate, whereas with regard to the other electrode, a wire of Au, Al or the like is bonded. In this connecting method, a wire must be bonded, and therefore the manufacturing process becomes complex. The addition of the wire causes an increase in the electric capacity or inductance. Therefore, with the conventional method, it is difficult to obtain the electrical performances which the compound semiconductor originally possesses.

As a solution to this problem, recently, a so-called flip-chip type structure, capable of achieving the electrical connection by simply mounting a compound semiconductor device. The following is a description of the compound semiconductor device, taking an example of the electrode structure in a semiconductor light-receiving element for optical communications.

FIG. 1 is a cross section showing a conventional semiconductor light-receiving element of a flip-chip type, in which light is made incident from the rear surface. The light-receiving element 6 consists of an $N^+$-InP substrate 1, an N-InP buffer layer 2, an InGaAs light absorption layer 3 and an $N^-$-InP cap layer 4.

More specifically, first, the N-InP buffer layer 2 is provided on the $N^+$-InP substrate 1, and the InGaAs light absorption layer 3 is provided on the N-InP buffer layer 2. Then, the $N^-$-InP cap layer 4 is formed on the InGaAs light absorption layer 3.

After that, for example, Zn is implanted selectively into the cap layer 4 as a P-type impurity, and a P-type impurity region 5 is formed in the light absorption layer 3 and the cap layer 4. Thus, a PN junction is formed between the P-type impurity region 5 and the light absorbing layer 3. Next, the cap layer 4, the light receiving layer 3 and the buffer layer 2 are etched, and these layers 4, 3 and 2 are separated into a region 7 in which a P-type electrode is formed (P-type electrode formation region) and a region 8 in which an N-type electrode is formed (N-type electrode formation region).

An insulating film 9 is provided on the cap layer 4 in the P-type electrode formation region 7. After that, a contact hole 9a is formed in the insulating film 9 at a location above the P-type impurity region 5. Next, a first electrode pad 13, which consists of a Ti layer 10, a Pt layer 11 and an Au layer 12, is provided in the contact hole 9a and on the insulating film 9, and a second electrode pad 14, which consists of the Ti layer 10, the Pt layer 11 and the Au layer 12, is provided on the cap layer 4 of the N-type electrode formation region 8.

After that, solder bumps (not shown) are formed on the first and second electrode pads 13 and 14. Next, a lens 15 is formed on the rear surface side of the $N^+$-InP substrate 1, on which light is made incident. A reflection preventing film 16 is formed on the lens 15.

FIG. 2 is a cross section showing an enlarged view of the main portion of the peripheral portion of the electrode obtained when the semiconductor light-receiving element shown in FIG. 1 is mounted on a mounting member. The flip-chip type semiconductor light receiving element, to which light is applied from the rear surface, is mounted on the mounting member 18 on which an electrode pattern 19 which corresponds to each of the electrode pads 13 and 14 is formed in advance with solder bumps 17 by the thermal pressure adhesion method.

The semiconductor light receiving element does not require a wire for wiring, and therefore the manufacture process can be simplified, and decreases in electric capacity and inductance can be suppressed. For the above-described reason, the above-described light receiving element has become the main focus of studies relating to the field of large capacity light receiving system, the demand of which has recently increased in recent times.

In the conventional rear-surface light incident flip-chip type semiconductor light receiving element, a possible pattern for the electrode pattern 19 is restricted, and therefore the area of the joint of the Ti layer 10, and the electrode forming regions 7 and 8 is rendered small as compared to the area of the chip surface. As a result, a stress is concentrated on the joint of the Ti layer 10, and the electrode forming regions 7 and 8 after the semiconductor light-receiving element is mounted on the mounting member 18, and therefore the semiconductor light receiving element, in some cases, fall off from the joint. In short, in the conventional semiconductor light-receiving element, a sufficient junction strength, which is required for preventing the falling-off of the device, cannot be obtained. As a solution to this problem, it may be considered that the area of the junction should be increased; however when the area of the junction is increased, the area of the PN junction is inevitably increased. With this increment, the electric capacity in the PN junction is increased, resulting in degradation of the performances of the semiconductor light receiving element.

Further, as shown in FIG. 2, the solder bumps 17 are melted on the electrode pad 13 and flows on the side surface of the electrode pad 13 in the mounting step. Consequently, a component such as Au or Sn, contained in the solder bumps 17 which have remained on the side surface, is not blocked by the Pt layer 11, which was supposed to serve as a barrier layer and prevent such entering of the solder components. Therefore, as shown in FIG. 3, the component flows onto the Ti layer 10, which is a contact layer, or underneath the layer. As a result, the component such as Au or Sn is diffused in the cap layer 4, which is a compound semiconductor region, and a region 20, which is made as the solder component erodes the cap layer 4, is formed. Due to the diffusion of Au or Sn, the PN junction of the semiconductor is destroyed, and the electrical or optical characteristics of the semiconductor element are degraded. The destruction of the junction may occur in the process of the mounting step; however it gradually proceeds when the compound semiconductor device obtained after the mounting process is used in practice. This results in a low long-term reliability of the device, which is particularly a serious problem in the case of the large-capacity optical communication system, for example.

In order to solve such a problem, the following idea has been proposed. That is, for example, the distance L from the contact hole 9a to the end of the first electrode pad 13 shown in FIG. 3 is increased so as to make the component Au or Sn not easily entering into the contact hole 9a. As the first technique, it is a possibility that the distance L is increased by expanding the first electrode pad 13 by the periphery thereof. With this expansion, the periphery of the P-type impurity region 5 expands outwards along the periphery of the first electrode pad 13. Consequently, the area of the PN junction of the P-type impurity region 5 increases to a certain degree; however it cannot be increased to a sufficient level due to the restrictions of electrical capacity. Therefore, the first technique is not very appropriate. As the second method, it is a possibility that the distance L is increased by reducing the size of the contact hole 9a of the insulating film 9. In this case, the contact area between the first electrode pad 13 and the electrode forming region 7 is made small; however it is not desired to reduce the size of the contact area very much because of the restriction of the contact resistance. In practice, it is difficult to increase the distance L to a sufficient level. Thus, with the conventional technique, the problem of a low long-term reliability cannot be solved.

SUMMARY OF THE INVENTION

The object of the present invention is to provide a semiconductor device having a high reliability and a high contact strength of the element after the element is mounted on the mount member.

The object can be achieved by a semiconductor device comprising:

a semiconductor chip having a structure in which an electrode is provided on a semiconductor substrate;

an electrode pad provided on the electrode;

a non-metal member provided for a surface, a periphery and a side surface of the electrode pad; and a mounting member for mounting the semiconductor chip with solder, by using an upper surface of the electrode pad as a contact surface.

According to the present invention, a non-metal member is provided for the surface, periphery and side surface of the electrode pad. With the member, the overflowing of the melted solder to the side surface of the electrode pad and the side surface of the electrode, which may take place when the semiconductor chip is mounted on the mounting member, can be prevented. With this structure, a component contained in solder does not overflow underneath the electrode pad, and therefore the deterioration of the electrical or optical characteristics of the semiconductor chip can be prevented. Thus, the reliability of the semiconductor device is not deteriorated.

Further, with the non-metal member provided for the surface, periphery and side surface of the electrode pad, the electrode pad is firmly fixed to the electrode. The electron pad can stand the tensile stress or dicing stress very remarkably as compared to the conventional semiconductor device, in which no non-metal member is provided. Thus, the strength of preventing the falling-off of the semiconductor chip can be very much enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiment of the present invention will now be described in detail with reference to drawings.

Figure 4:
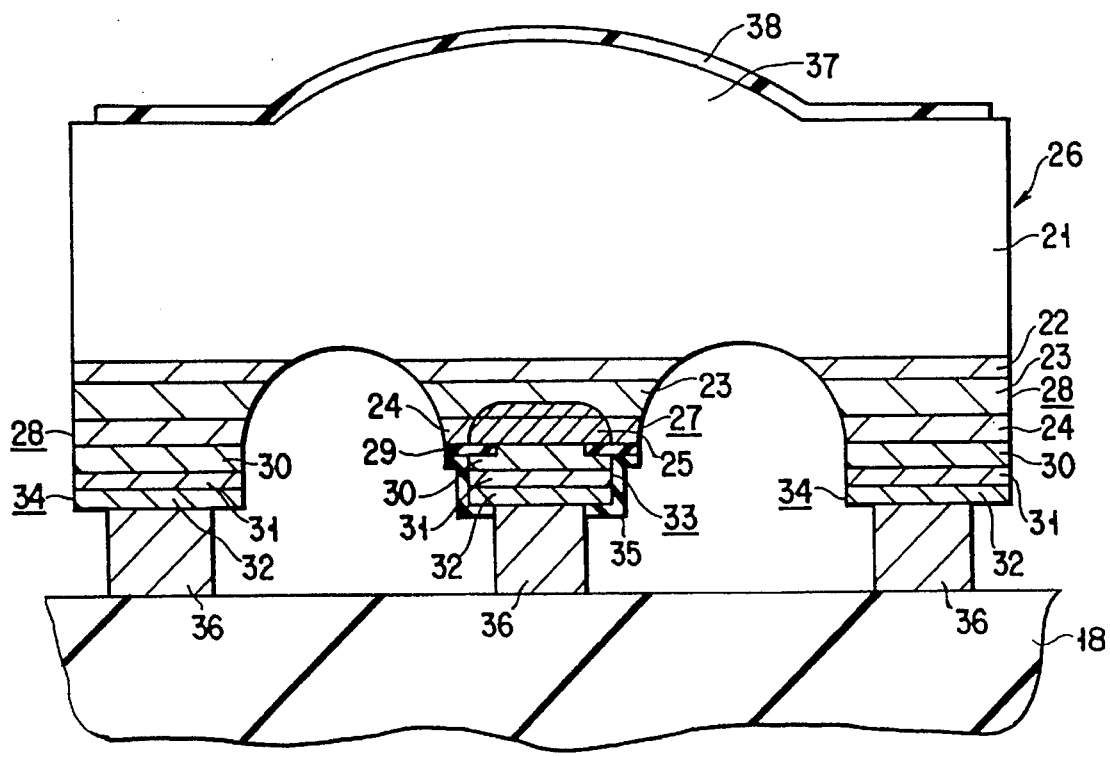
FIG. 4 is a cross section showing a flip-chip type semiconductor light-receiving element in which light is made incident from the rear surface thereof, according to the first embodiment of the present invention.

FIG. 4 is a cross section showing a flip-chip type semiconductor light-receiving element in which light is made incident from the rear surface thereof, according to the first embodiment of the present invention. A light-receiving element 26 consists of an $N^+$-InP substrate 21, an N-InP buffer layer 22, an InGaAs light-absorbing layer 23 and an $N^-$-InP cap layer 24.

More specifically, first, the N-InP buffer layer 22 having a carrier concentration of $1\times10^{15}$ cm$^{-3}$ and a thickness of 2 µm is deposited on the surface of the $N^+$-InP substrate 21 by MOCVD (metal organic chemical vapor deposition) method. Then, the InGaAs light absorbing layer 23 having a thickness of 2 µm is deposited on the N-InP buffer layer 22 by the MOCVD method. Next, the $N^-$-InP cap layer 24 having a carrier concentration of $1\times10^{15}$ cm$^{-3}$ and a thickness of 1 µm is deposited on the InGaAs light-absorbing layer 23 by the MOCVD method.

After that, the first silicon nitride film (not shown) is deposited on the cap layer 24 by plasma CVD method. The first silicon nitride film is patterned by photolithography, and thus the first mask film (not shown) made of silicon nitride is formed on the cap layer 24. Next, the InP substrate 21 is placed in a diffusion furnace (not shown). Next, in an atmosphere of zinc dimethyl gas, under the conditions that the temperature is set to 500° C. and the time period is set to 30 minutes, zinc is selectively diffused into the light-absorbing layer 23 and the cap layer 24, using the first masking film as a mask. Thus, a P-type impurity region 25 is formed in the light-absorbing layer 23 and the cap layer 24. Consequently, a PN junction is formed between the light-absorbing layer 23 and the P-type impurity region 25.

Next, the first masking film is removed. After that, the second silicon nitride film (not shown) is deposited on the cap layer 24. The second silicon nitride film is patterned by photolithography, and thus the second masking film (not shown) made of silicon nitride is formed on the cap layer 24. With using of the second masking film as a mask, the cap layer 24, the light absorbing layer 23 and the buffer layer 22 are removed by wet etching. Next, the second masking film is removed, and a region 27 in which a P-type electrode consisting of the cap layer 24, the light-absorbing layer 23 and the buffer layer 22 is formed (P-type electrode forming region), and regions 28 in each of which an N-type electrode is formed (N-type electrode forming region) are formed. The P-type electrode forming region 27 is situated between the N-type electrode forming regions 28.

After that, an insulating film 29 made of, for example, a silicon nitride film, is provided on the periphery portion of the P-type impurity region 25 on the surface of the cap layer 24. Next, a first electrode pad 33 having a multilayer structure is formed on the P-type electrode forming region 27, and a second electrode pad 34 having a multilayer structure is formed on each of the N-type electrode forming region 28, both by the vacuum deposition method. More specifically, a Ti layer 30 having a thickness of 100 nm is formed on the P-type electrode forming region 27, the P-type impurity region 25 and the insulating film 29 by the vacuum deposition method, and a Pt layer 31 having a thickness of 100 nm is formed on the Ti layer 30 by the vacuum deposition method. Further, an Au layer 32 having a thickness of 100 nm is formed on the Pt layer 31 by the vacuum deposition method. Thus, the first electrode pad 33 consisting of the Ti layer 30, the Pt layer 31 and the Au layer 32 is formed on the P-type impurity region 25 and the insulating film 29, and the second electrode pads 34 each consisting of the Ti layer 30, the Pt layer 31 and the Au layer 32 are formed on the cap layers 24.

The insulating film 29 serves to electrically insulate the first electrode pad 33 and the N⁻-InP cap layer 24 from each other. The Ti layer 30 functions as a contact layer for assuring the electrical contact with the InP cap layer 24 in each of the P-type electrode forming region 27 and the N-type electrode forming regions 28. The Pt layer 31 functions as a barrier layer for preventing the mutual diffusion of metal elements between the Ti layer 30 and the Au layer 32. The Au layer 32 is integrated with the solder bumps after the mounting step so as to achieve the electrical junction.

Next, a non-metal member 35 made of a silicon nitride film, is deposited on the first and second electrode pads 33 and 34 and the insulating film 29 by the plasma CVD method. After that, the non-metal member 35 is patterned by the photolithography, and thus the non-metal member 35 is formed on the insulating film 29 and the surface, the periphery and the side surface of the first electrode pad 33.

After that, a solder bump 36 made of Au and Sn is provided on each of the first and second electrode pads 33 and 34 by an electric plating method. Then, a lens-like resist (not shown) is formed on the rear surface, which is the light incident side, of the N⁺-InP substrate 21. This resist and the entire rear surface of the N⁺-InP substrate 21 are polished by ion milling, thus forming an InP monolithic lens 37 on the rear side of the InP substrate 21. Then, a reflection preventing film 38 made of silicon nitride is formed on the lens 37 and the rear surface of the InP substrate 21 by the plasma CVD method.

The flip-chip type semiconductor light receiving element, on which light is made incident from the rear surface, is mounted on the ceramic carrier used only as a mounting member 18, by the solder bump 36 by thermal pressure adhesion method. Electrode patterns corresponding to the first and second electrode pads 33 and 34 are formed in advance on the surface of the ceramic carrier. Thus, the P-type electrode forming region 27 and the N-type electrode forming regions 28 are electrically connected to the ceramic carrier via the solder bump 36 and the first and second electrode pads 33 and 34.

Figure 1:
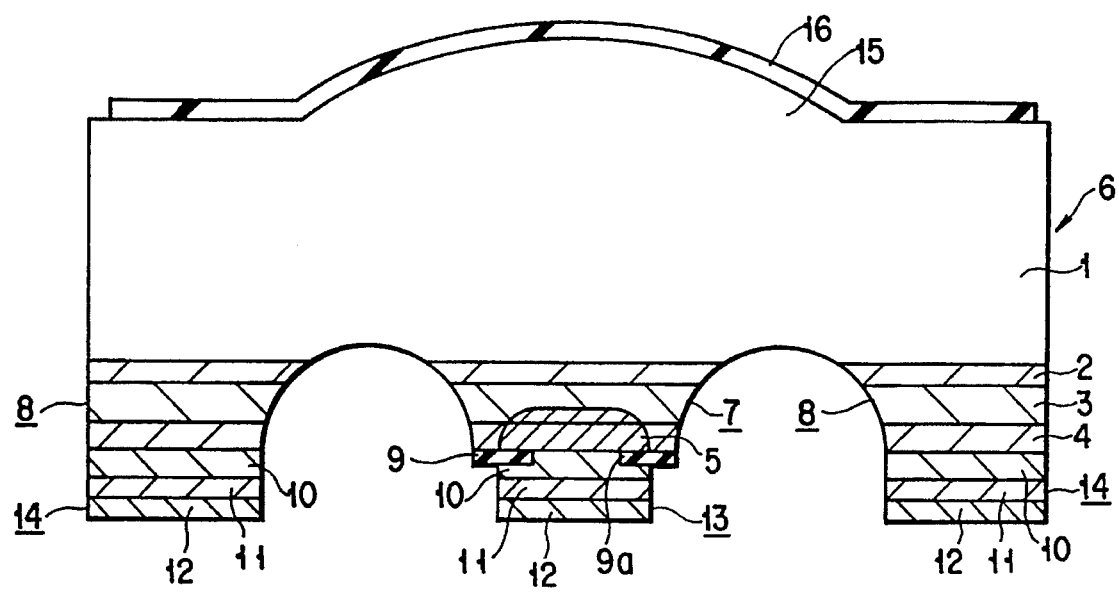
FIG. 1 is a cross section showing a conventional flip-chip type semiconductor light-receiving element in which light is made incident from the rear surface thereof.
Figure 2:
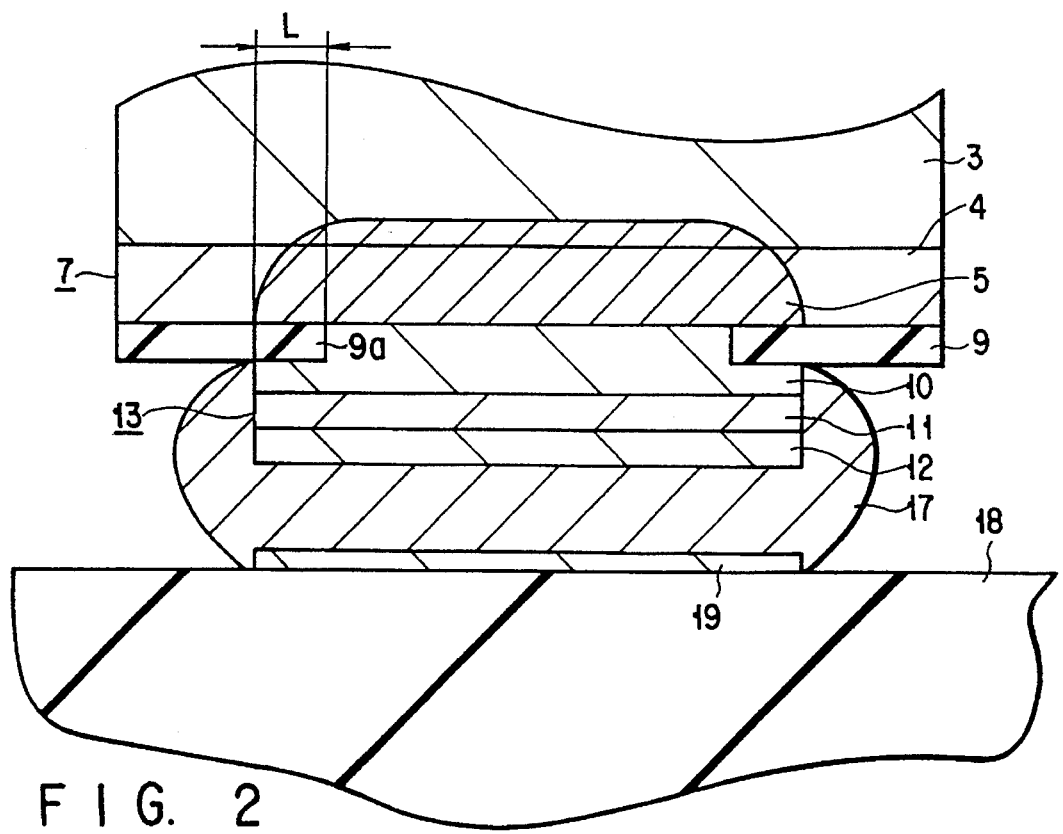
FIG. 2 is a cross section showing an enlarged view of the main portion of the periphery of the electrode when the flip-chip type semiconductor light-receiving element shown in FIG. 1 is mounted on the mounting member.
Figure 3:
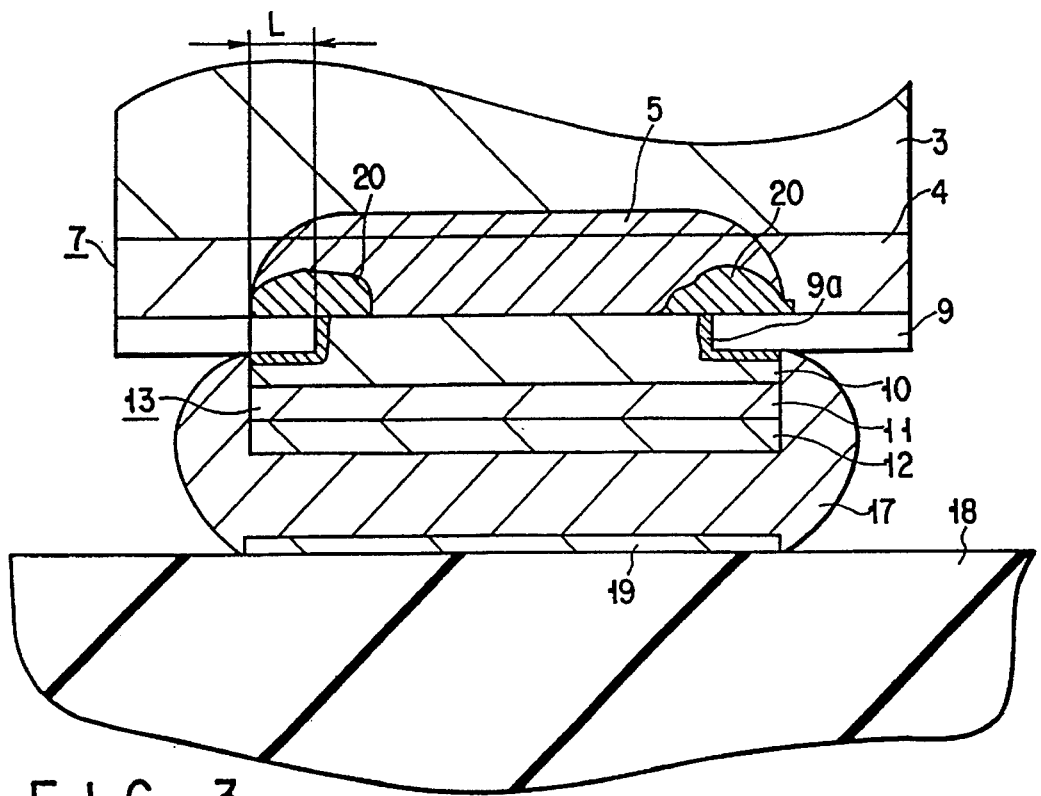
FIG. 3 is a cross section schematically showing a region eroded by a solder component, in the periphery of the electrode when the flip-chip type semiconductor light-receiving element shown in FIG. 1 is mounted on the mounting member.

In the first embodiment, the surface, the periphery and the side surface of the first electrode pad 33 is covered by the non-metal member 35. A melted portion of the solder bump 36, which results when the semiconductor light receiving element is mounted on the ceramic carrier by the thermal pressure method, can be prevented from coming around to the side surface of the first electrode pad 33. Consequently, the metal portion of the solder bump 36 can be prevented from changing properties of the semiconductor (see numeral 20 in FIG. 3), which is caused by diffusion of the metal portion into the semiconductor. Further, the melted portion of the solder bump 36 can be prevented from overflowing to the side surface of the P-type electrode forming region 27. More specifically, with the structure of the conventional flip-chip type semiconductor light receiving element, the melted portion of the solder bump overflows to the surface and the entire side surface of the electrode pad during the mounting step, and in some cases, even reaches the P-type electrode forming region by pressure adhesion. Such overflow of solder bump results in formation of excessive MIS (Metal-Insulator-Semiconductor) structure, causing an increase in electrical capacity and a decrease in ESD (Electro-Static-Discharge) threshold. In this embodiment, the side surface and the like of the electrode pad 33 is covered by the non-metal member 35, which suppress the diffusion of the melted portion of the solder bump 36, and therefore the melted portion does not overflow to the P-type electrode forming region 27. In other words, the non-metal member 35 has a low wettability with respect to solder, and therefore the melted portion of the solder bump 36 does not easily overspread. Thus, a melted portion of the solder bump 36 does not overflow to the side surface of the P-type electrode forming region 27. Consequently, a component contained in the solder bump 36, such as Au or Sn, does not diffuse to the Ti layer 30 or enter underneath the layer, and therefore the degradation of the electrical or optical characteristics of the semiconductor light receiving element can be avoided. Consequently, a decrease in the reliability of the compound semiconductor device can be prevented.

When a material having a particularly low wettability with respect to the solder bump 36 is selected as the material for the non-metal member 35, the above-described solder bump overflow suppressing effect can be further enhanced.

Moreover, when the first electrode pad 33 is covered by the non-metal member 35, the electrode pad 33 is firmly fixed to the P-type electrode forming region 27. Consequently, the first electrode pad 33 can be made remarkably strong against the tensile stress or dicing stress, as compared to the conventional compound semiconductor device in which the electrode pad is not covered by the non-metal member 35. Thus, the resistance to the falling-off of the element (to be called "adhesion strength" hereinafter) can be significantly improved. That is, even if the area of the contact surface between the Ti layer 30 of the first electrode pad 33 and the P-type electrode forming region 27 is small as compared to the size of the chip, the falling off of the semiconductor light receiving element from the mounting member, caused by the concentration of the stress to this joint, can be prevented. In other words, the falling off of the semiconductor light receiving element from the mounting member, can be prevented without increasing the area of the joint.

With regard to the conventional flip-chip type semiconductor light receiving element, the average adhesion strength of chips after being mounted is 30 gf, whereas with regard to the flip-chip type semiconductor light receiving element of the present invention, the average adhesion strength of chips after being mounted is 80 gf. Therefore, errors due to lack of the mounting strength, caused by falling-off of the electrode can be significantly suppressed. With the present invention, a series of original characteristics of the flip-chip type semiconductor light receiving element are as good as those of the conventional element.

According to the results of an accelerated degradation test carried out at an applied bias of 20 V and at a temperature of 250° C., the average life of the conventional flip-chip type semiconductor light receiving element is 1000 hours or less, whereas the average life of the semiconductor light receiving device of 2000 hours or more. It was confirmed from the results that the life of the element could be drastically prolonged. The reason for being able to prolong the life of element is that the non-metal member 35 which covers the first electrode pad 33, serves as a protection layer for the electrode forming region 27, thus avoiding the entering and diffusion of a solder component element from the side surface of the first electrode pad 33.

Since the non-metal member 35 is provided for the side surface and the like of the first electrode pad 33, the non-metal member 35 can be used as a mask when the solder bump 36 is formed on the first electrode pad 33 by the electrolytic plating method. Therefore, the solder bump 36 can be easily formed at a desired position with accuracy, and thus the manufacturing process can be facilitated, and the production cost can be reduced.

The first embodiment is described in connection with the case where the present invention is applied to a flip-chip type semiconductor light receiving element to which light is made incident from the rear surface; however the present invention is can be applied to other semiconductor devices, for example, electronic devices such as a light-emitting diode, a semiconductor laser, a high mobility transistor (HEMT), an electric field effect transistor (MISFET or MOSFET) and a hetero bipolar transistor (HBT), or an optoelectronic IC obtained by combining these devices.

In the above embodiment, the present invention is applied to an InP or InGaAs compound semiconductor device; however the invention can be applied to other compound semiconductor devices, for example, GaAs, AlGaAs, ZnSe or CdTe compound semiconductor devices.

In this embodiment, the non-metal member 35 made of silicon nitride is deposited on the first and second electrode pads 33 and 34; however it is also a possibility that a non-metal member made of silicon oxide or polyimide, is deposited on the first and second electrode pads 33 and 34.

In this embodiment, the electrode pads 33 and 34 having a three-layer structure made of the Ti layer 30, the Pt layer 31 and the Au layer 32, are formed respectively on the first and second electrode pads 33 and 34; however it is also a possibility that electrode pads having a metal layer made of one element selected from the group consisting of at least Ni, Pd, Pt, Rh and Ti are formed respectively on the P-type electrode forming region 27 and the N-type electrode forming regions 28.

In this embodiment, the electrode pads 33 and 34 having a laminated-layer structure are formed respectively on the P-type electrode forming region 27 and the N-type electrode forming regions 28; however it is also a possibility that electrode pads made of a single metal layer are formed respectively on the P-type electrode forming region 27 and the N-type electrode forming regions 28.

In this embodiment, the solder bump 36 containing Au and Sn is formed on each of the first and second electrode pads 33 and 34; however it is also a possibility that solder bumps mainly containing one element selected from the group consisting of at least Au, Sn, Pb and In are formed respectively on the first and second electrode pads 33 and 34.

Figure 5:
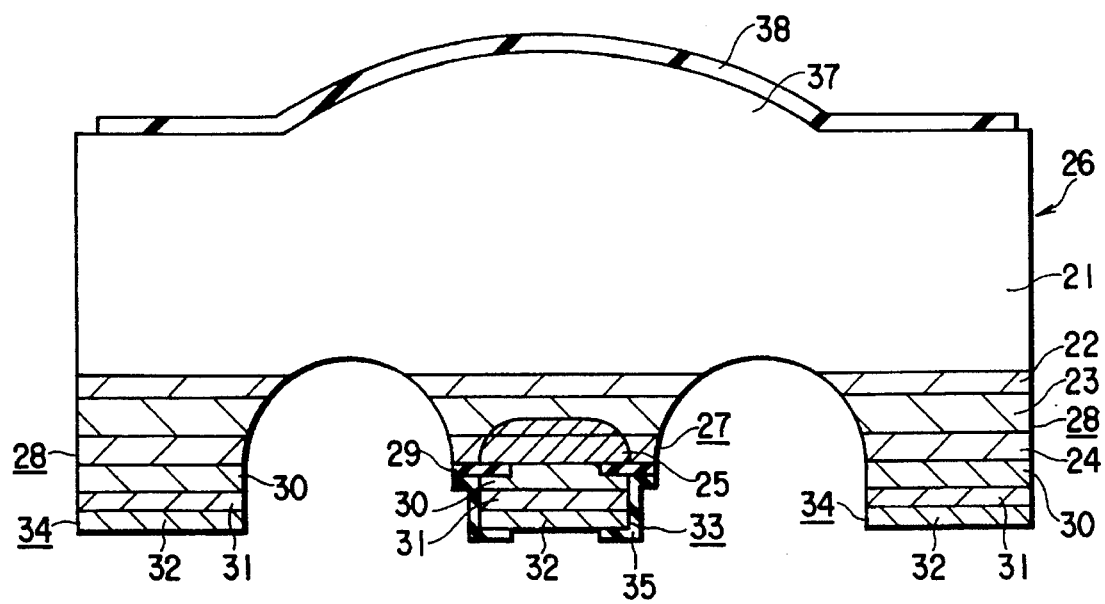
FIG. 5 is a cross section showing a flip-chip type semiconductor light-receiving element in which light is made incident from the rear surface thereof, according to the second embodiment of the present invention.

FIG. 5 is a cross section showing a flip-chip type semiconductor light-receiving element in which light is made incident from the rear surface thereof, according to the second embodiment of the present invention, and the same structural elements as those shown in FIG. 4 are designated by the same reference numerals. With regard to the second embodiment, only sections different from those of the first embodiment will be described.

In the second embodiment, no solder bumps are formed on the first and second electrode pads 33 and 34, and therefore solder must be supplied in a so-called preform, when a semiconductor light-receiving element is mounted on a ceramic carrier (not shown) of an exclusive use. The preform of solder is a lump having a predetermined size. The solder mainly contains one of at least Au, Sn, Pb and In.

A preform lump of solder is placed on the ceramic carrier, and the solder is melted by heat. While the solder is in a molten state, the semiconductor light receiving element is mounted on the ceramic carrier, and the semiconductor light-receiving element is fixed by the solder.

In the second embodiment, the same advantage as that of the first embodiment can be achieved.

In the second embodiment, solder is supplied in preform when mounting an light-receiving element; however it is also a possibility that solder is formed in advance on the exclusive-use ceramic carrier.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate having an electrode forming region provided thereon, said electrode forming region including an impurity region;

an insulating film provided on said electrode forming region, said insulating film having an opening exposing said impurity region;

an electrode pad provided on said insulating film, said electrode pad being in contact with said impurity region through said opening of said insulating film; and a non-metal member provided on a surface and a side surface of said electrode pad, said non-metal member having an opening exposing said surface of said electrode pad, wherein said non-metal member prevents a metal component contained in a solder provided on said surface of said electrode pad from diffusing into said impurity region through the opening of said insulating film.

2. A semiconductor device according to claim 1, wherein said non-metal member is made of one of silicon oxide, silicon nitride and polyimide.

3. A semiconductor device according to claim 2, wherein said electrode pad includes a metal layer made of at least Ni, Pd, Pt, Rh and Ti.

4. A semiconductor device according to claim 3, wherein said electrode pad is made of one of a single and a plurality of metal layers.

5. A semiconductor device according to claim 4, wherein said solder mainly contains one of the group consisting of at least Au, Sn, Pb and In.

6. A semiconductor device comprising:

a semiconductor substrate having an electrode forming region provided thereon, said electrode forming region including an impurity region;

an insulating film provided on said electrode forming region, said insulating film having an opening exposing said impurity region;

an electrode pad provided on said insulating film, said electrode pad being in contact with said impurity region through said opening of said insulating film;

a non-metal member provided on a surface and a side surface of said electrode pad, said non-metal member having an opening exposing said surface of said electrode pad; and a solder bump provided on said surface of said electrode pad though the opening of said non-metal member, wherein said non-metal member prevents a metal component contained in said solder bump from diffusing into said impurity region.

7. A semiconductor device according to claim 6, wherein said non-metal member is made of one of silicon oxide, silicon nitride and polyimide.

8. A semiconductor device according to claim 6, wherein said electrode pad includes a metal layer made of at least Ni, Pd, Pt, Rh and Ti.

9. A semiconductor device according to claim 6, wherein said electrode pad is made of one of a single and a plurality of metal layers.

10. A semiconductor device according to claim 6, wherein said solder bump mainly contains one of the group consisting of at least Au, Sn, Pb and In.

11. A semiconductor device comprising:

a semiconductor substrate having an electrode forming region provided thereon, said electrode forming region including an impurity region;

an insulating film provided on said electrode forming region, said insulating film having an opening exposing said impurity region;

an electrode pad provided on said insulating film, said electrode pad being in contact with said impurity region through said opening of said insulating film;

a non-metal member provided on a surface and a side surface of said electrode pad, said non-metal member having an opening exposing said surface of said electrode pad; and a mounting member for mounting said semiconductor substrate with solder by using said surface of said electrode pad as a contact surface, wherein said non-metal member prevents a metal component contained in a solder provided on said surface of said electrode pad from diffusing into said impurity region through the opening of said insulating film.

12. A semiconductor device according to claim 11, wherein said non-metal member is made of one of silicon oxide, silicon nitride and polyimide.

13. A semiconductor device according to claim 12, wherein said electrode pad includes a metal layer made of at least Ni, Pd, Pt, Ph and Ti.

14. A semiconductor device according to claim 13, wherein said electrode pad is made of one of a single and a plurality of metal layers.

15. A semiconductor device according to claim 14, wherein said solder mainly contains one of the group consisting of at least Au, Sn, Pb and In.

16. A semiconductor device according to claim 1, wherein said electrode forming region includes a buffer layer, light absorbing layer and cap layer, said impurity region being located in said cap layer and said light-absorbing layer.

17. A semiconductor device according to claim 1, wherein said non-metal member prevents at least one of Au, Sn, Pb, and In contained in said solder from diffusing into said impurity region.

18. A semiconductor device according to claim 1, wherein said impurity region and said electrode forming region are a p-type.

19. A semiconductor device according to claim 18, and further comprising:

n-type electrode forming regions arranged at both sides of said p-type electrode forming regions.

20. A semiconductor device according to claim 19, wherein said non-metal member being provided on only said p-type electrode forming region.

21. A semiconductor device according to claim 6, wherein said electrode forming region includes a buffer layer, light absorbing layer and cap layer, said impurity region being located in said cap layer and said light-absorbing layer.

22. A semiconductor device according to claim 6, wherein said non-metal member prevents at least one of Au, Sn, Pb, and In contained in said solder from diffusing into said impurity region.

23. A semiconductor device according to claim 6, wherein said impurity region and said electrode forming region are a p-type.

24. A semiconductor device according to claim 23, and further comprising:

n-type electrode forming regions arranged at both sides of said p-type electrode forming regions.

25. A semiconductor device according to claim 24, wherein said non-metal member being provided on only said p-type electrode forming region.

26. A semiconductor device according to claim 11, wherein said electrode forming region includes a buffer layer, light absorbing layer and cap layer, said impurity region being located in said cap layer and said light-absorbing layer.

27. A semiconductor device according to claim 11, wherein said non-metal member prevents at least one of Au, Sn, Pb, and In contained in said solder from diffusing into said impurity region.

28. A semiconductor device according to claim 11, wherein said impurity region and said electrode forming region are a p-type.

29. A semiconductor device according to claim 28, and further comprising:

n-type electrode forming regions arranged at both sides of said p-type electrode forming regions.

30. A semiconductor device according to claim 29, wherein said non-metal member being provided on only said p-type electrode forming region.

* * * * *